United States Patent
Bertram et al.

(10) Patent No.: US 7,920,019 B2
(45) Date of Patent: Apr. 5, 2011

(54) MICROPROCESSOR WITH SUBSTRATE BIAS CLAMPS

(75) Inventors: Raymond A. Bertram, Austin, TX (US);
Mark J. Brazell, Cedar Park, TX (US);
Vanessa S. Canac, Austin, TX (US);
Darius D. Gaskins, Austin, TX (US);
James R. Lundberg, Austin, TX (US);
Matthew Russell Nixon, Austin, TX (US)

(73) Assignee: VIA Technologies, Inc., New Taipei (TW)

( * ) Notice: Subject to any disclaimer, the term of this patent is extended or adjusted under 35 U.S.C. 154(b) by 201 days.

(21) Appl. No.: 12/237,463

(22) Filed: Sep. 25, 2008

(65) Prior Publication Data

US 2010/0073073 A1 Mar. 25, 2010

(51) Int. Cl.
*G05F 3/24* (2006.01)
(52) U.S. Cl. ............... 327/537; 327/543; 327/544
(58) Field of Classification Search .............. None
See application file for complete search history.

(56) References Cited

U.S. PATENT DOCUMENTS

| | | | |
|---|---|---|---|
| 5,557,231 A | | 9/1996 | Yamaguchi et al. |
| 6,034,563 A | * | 3/2000 | Mashiko ............ 327/544 |
| 6,218,895 B1 | * | 4/2001 | De et al. ............ 327/566 |
| 6,232,793 B1 | * | 5/2001 | Arimoto et al. ......... 326/34 |
| 6,635,934 B2 | * | 10/2003 | Hidaka .............. 257/369 |
| 6,696,865 B2 | | 2/2004 | Horiguchi et al. |
| 6,744,301 B1 | | 6/2004 | Tschanz et al. |
| 6,967,522 B2 | | 11/2005 | Chandrakasan et al. |
| 7,161,408 B2 | | 1/2007 | Mizuno et al. |
| 7,164,307 B2 | | 1/2007 | Tschanz et al. |
| 7,355,437 B2 | * | 4/2008 | Perisetty ............ 326/14 |
| 7,397,282 B2 | * | 7/2008 | Mizuno et al. .......... 326/81 |
| 2008/0174359 A1 | * | 7/2008 | Osada et al. .......... 327/534 |

* cited by examiner

*Primary Examiner* — Lincoln Donovan
*Assistant Examiner* — Terry L Englund
(74) *Attorney, Agent, or Firm* — Gary R. Stanford; James W. Huffman

(57) ABSTRACT

A microprocessor including a substrate bias rail providing a bias voltage during a first operating mode, a supply node providing a core voltage, a clamp device coupled between the bias rail and the supply node, and control logic. The control logic turns on the clamp device to clamp the bias rail to the supply node during a second operating mode and turns off the clamp device during the first operating mode. The clamp devices may be implemented with P-channel and N-channel devices. Level shift and buffer circuits may be provided to control the clamp devices based on substrate bias voltage levels. The microprocessor may include a substrate with first and second areas each including separate substrate bias rails. The control logic separately turns on and off clamp devices to selectively clamp the substrate bias rails in the first and second areas based on various power modes.

15 Claims, 5 Drawing Sheets

MICROPROCESSOR WITH SUBSTRATE BIAS CLAMPS

CROSS-REFERENCE TO RELATED APPLICATIONS

This application is related to the following co-pending U.S. Patent Applications, each of which has a common assignee and common inventors.

| SERIAL NUMBER | FILING DATE | TITLE |
| --- | --- | --- |
| 12/237,483 (CNTR.2425) | Sep. 25, 2008 | MICROPROCESSOR WITH SELECTIVE SUBSTRATE BIASING FOR CLOCK-GATED FUNCTIONAL BLOCKS |

BACKGROUND OF THE INVENTION

1. Field of the Invention

The present invention relates to substrate biasing provided on a microprocessor die to reduce sub-threshold leakage, and more particularly to an apparatus and method for clamping substrate bias rails to respective core voltages to minimize noise on device substrates and thus to improve device performance.

2. Description of the Related Art

Complementary Metal-Oxide Semiconductor (CMOS) circuitry dissipates less power and is more dense than other types of integrated circuit (IC) technologies so that CMOS technology has become the dominant style of digital circuit design for integrated circuits. CMOS circuits use a combination of N channel (NMOS) and P channel (PMOS) devices each having a threshold gate-to-source voltage based on design, scale, materials and process. As IC design and fabrication techniques continue to evolve, operating voltages and device size have each scaled downward. The 65 nanometer (65 nm) process is an advanced lithographic process used for volume CMOS semiconductor fabrication and is particularly advantageous for Very Large Scale Integrated (VLSI) circuits, such as microprocessors and the like. As device size and voltage levels have decreased, the channel lengths and oxide thicknesses of each device have also decreased. Manufacturers have also switched to gate materials causing lower voltage thresholds which have further led to increased sub-threshold leakage current. Sub-threshold leakage current is the current that flows between the drain and source when the gate-to-source voltage is below the threshold voltage of the CMOS device. In many conventional circuits the substrate interface, also referred to as the well or bulk tie, of each CMOS device is coupled to a corresponding one of the power rails (e.g., PMOS bulk tied to VDD and NMOS bulk tied to VSS). In such conventional configurations the sub-threshold leakage current may account for nearly 30% or more of total power consumption in the dynamic environment (e.g., during normal operation).

It is often desired to operate an IC in a low power mode (e.g., sleep or hibernation mode) and reduce power consumption as much as possible. A bias generator or charge pump is used to bias device substrates to a voltage level other than the supply voltages during low power mode. The bias generator may be provided on the chip die or off-chip. In either case, the bias generator raises the bulk tie of PMOS devices above VDD and lowers the voltage of the bulk tie of NMOS devices below VSS. Such substrate biasing significantly reduces the sub-threshold leakage current during low power mode thereby conserving a substantial amount of power. In a large scale device, however, such as a microprocessor or the like, the substrate bias voltages need to be delivered to a substantial number of devices distributed across the chip die. Although it is possible to provide multiple bias generators on the chip die, they consume valuable die area so that it is desired to minimize the number of bias generators provided. The substrate bias rails are routed as far as possible across the chip die to deliver the bias voltages. In low power mode, the bias generator drives the substrate bias voltages to minimize sub-threshold leakage current and reduce power. In the dynamic environment, the bias generator drives the voltage of the bias rails to the corresponding supply voltages in an attempt to improve device performance. A significant level of impedance is associated with the bias rail distribution, resulting in voltage variations on substrates across the IC. The bias voltage rails also introduce noise caused by capacitive coupling degrading device performance.

It is desired to distribute substrate bias voltage rails throughout the die of a large scale device, such as a microprocessor or the like, while minimizing voltage variations and noise and maintaining device performance.

SUMMARY OF THE INVENTION

A microprocessor according to one embodiment includes a first substrate bias rail which provides a first bias voltage during a first operating mode, a first supply node providing a core voltage, at least one clamp device coupled between the first substrate bias rail and the first supply node, and control logic. The control logic turns on the clamp device to clamp the first substrate bias rail to the first supply node during a second operating mode and turns off the clamp device during the first operating mode.

The clamp device may be a semiconductor device, such as an N-channel or a P-channel device or the like. The first substrate bias rail is charged to the first bias voltage at an offset voltage relative to the core voltage. Level shift logic may be included to switch the clamp device at bias voltage levels to ensure it is turned off during the first operating mode. Buffers may be included to control multiple clamp devices.

The microprocessor may include first and second substrate bias rails in which the second substrate bias rail provides a second bias voltage during the first operating mode. In one embodiment, the first bias voltage is provided at a positive voltage offset relative to the core voltage and the second bias voltage is provided at a negative voltage offset relative to a reference voltage during the first operating mode.

The microprocessor may include a substrate having a first area and a separate second area. In one embodiment, the first substrate bias rail is located within the first area for biasing semiconductor devices located in the first area during the first operating mode while semiconductor devices in the second area remain powered on. A second substrate bias rail may be included in the second area with clamp devices. The control logic may selectively turn on and off clamp devices coupled to the first and second substrate bias rails.

An integrated circuit according to one embodiment includes a substrate, first and second bias rails provided on the substrate, a first supply conductor provided on the substrate and providing a positive core voltage relative to a reference voltage provided by a second supply conductor provided on the substrate, at least one first clamp device provided on the substrate and coupled between the first supply conductor and the first bias rail, at least one second clamp device provided on the substrate and coupled between the second supply conductor and the second bias rail, and a control circuit. A first bias voltage is provided on the first bias rail and a second bias voltage is provided on the second bias rail during a first state of the integrated circuit, where the first bias voltage is above the core voltage and where the second bias voltage is below the reference voltage. The control circuit has a first output for controlling the first clamp device and a second output for controlling the second clamp device. The control circuit turns off the first and second clamp devices during the first state, and turns on the first and second clamp devices during a second state to clamp the first bias rail to the first supply conductor and to clamp the second bias rail to the second supply conductor.

The integrated circuit may include level shift circuits to turn on and off the clamp devices based on substrate bias voltage levels. The integrated circuit may include buffer circuits coupled to the clamp devices. The substrate may be divided into first and second areas each having semiconductor devices where the first and second bias rails and the first clamp device are located exclusively within the first area of the substrate.

A method of reducing noise of a microprocessor chip which includes a first substrate bias rail used to reduce sub-threshold leakage and which develops a core voltage according to one embodiment includes clamping the first substrate bias rail to the core voltage when the microprocessor chip is in a first power state, and unclamping the first substrate bias rail and receiving a first substrate bias voltage on the first substrate bias rail when the microprocessor chip is in a second power state.

The method may include turning on a first set of clamp devices distributed along the first substrate bias rail at locations selected to maintain voltage of the first substrate bias rail within a predetermined voltage offset relative to the core voltage. The method may include connecting a drain and a source of a first semiconductor device between the first substrate bias rail and the core voltage, turning on the first semiconductor device when the microprocessor is in the first power state, and turning off the first semiconductor device when the microprocessor is in the second power state. The method may include charging the first substrate bias rail to an offset voltage relative to the core voltage, and providing a first clamp enable signal which asserts a gate of the first semiconductor device to the offset voltage relative to the core voltage. The method may include connecting a drain and a source of a second semiconductor device between the first substrate bias rail and the core voltage, and providing a buffer on the microprocessor chip which receives the first clamp enable signal and which provides a second clamp enable signal to a gate of the second semiconductor device. In one embodiment, the second clamp enable signal follows the voltage level of the first clamp enable signal.

The microprocessor chip may be divided into first and second areas and may include a second substrate bias rail. In one embodiment, the first substrate bias rail is located within the first area and the second substrate bias rail is located in the second area. In this case, the method may further include selectively clamping the first and second substrate bias rails to the core voltage or unclamping the bias rails and receiving corresponding bias voltages on the bias rails in various power states of the microprocessor chip.

BRIEF DESCRIPTION OF THE DRAWINGS

The benefits, features, and advantages of the present invention will become better understood with regard to the following description, and accompanying drawings where.

DETAILED DESCRIPTION

The following description is presented to enable one of ordinary skill in the art to make and use the present invention as provided within the context of a particular application and its requirements. Various modifications to the preferred embodiment will, however, be apparent to one skilled in the art, and the general principles defined herein may be applied to other embodiments. Therefore, the present invention is not intended to be limited to the particular embodiments shown and described herein, but is to be accorded the widest scope consistent with the principles and novel features herein disclosed.

The present inventors have observed that conventional substrate bias rails used to bias device substrates to a voltage level other than the supply voltages during low power mode exhibit significant impedance and capacitive noise coupling. The disadvantages include, for example, increasing voltage drop along the length of the substrate bias rails resulting in significant voltage variations of substrate bias voltage, and noise coupled into devices during normal operation significantly reducing performance. They have therefore developed a microprocessor with substrate bias clamps to reduce voltage variations and noise coupling, as will be further described below with respect to FIGS. 1-8.

Figure 1:
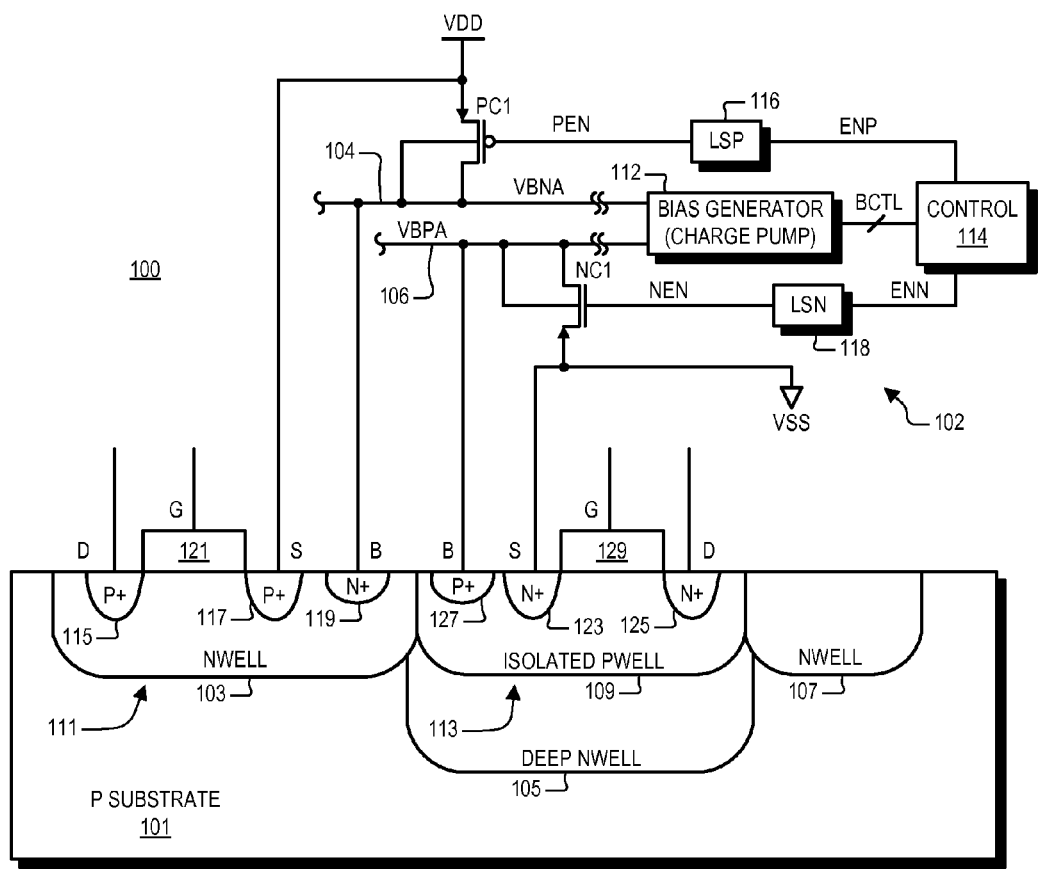
FIG. 1 is a figurative diagram of an integrated circuit (IC) including exemplary CMOS devices integrated onto a P substrate, and further showing a schematic and block diagram of a substrate bias circuit integrated onto the IC and including substrate bias clamps implemented according to an exemplary embodiment.

FIG. 1 is a figurative diagram of an integrated circuit (IC) 100 including exemplary CMOS devices integrated onto a P substrate 101, and further showing a schematic and block diagram of a substrate bias circuit 102 integrated onto the IC 100 and including substrate bias clamps implemented according to an exemplary embodiment. The particular device configuration shown is referred to as the "twin-well" process although other types of processes are contemplated, such as N-well, P-well, triple-well, etc. Several N-type well (NWELL) regions 103, 105 and 107 are formed within the bulk P-substrate 101 in which the NWELL region 105 is a deep NWELL region. An isolated P-type well (PWELL) region 109 is formed within the deep NWELL region 105. The first NWELL region 103 is used to fabricate a P-channel device 111 and the isolated PWELL region 109 is used to fabricate an N-channel device 113. The third NWELL region 107 may be used to implement another device as understood by those skilled in the art and is not further described herein. Although only two devices 111 and 113 are shown and described, it is understood that any number of additional devices may be implemented on the P substrate 101.

A pair of P-type diffusion regions (P+) 115 and 117 and an N-type diffusion region (N+) 119 are formed within the NWELL region 103 of the P-channel device 111. The P-channel device 111 further includes a gate insulator layer 121 formed on the NWELL region 103 overlapping the P-type diffusion regions 115 and 117. The P+ region 115 forms the drain terminal, denoted "D", the P+ region 117 forms the source terminal, denoted "S", and the gate insulator 121 forms the gate terminal, denoted "G", of the P-channel device 111. The gate and drain terminals of the P-channel device 111 are coupled to corresponding signals (not shown) on the IC 100 depending upon the particular function of the device. The source terminal of the P-channel device 111 is shown coupled to a core voltage VDD. The N+ region 119 forms a well or bulk connection, denoted "B", which is coupled to a substrate bias rail 104 providing a substrate bias voltage VBNA for P-channel devices. For the N-channel device 113, a pair of N-type diffusion regions (N+) 123 and 125 and a P-type diffusion region (P+) 127 are formed within the isolated PWELL region 109 and a gate insulator layer 129 is formed on the PWELL region 109 overlapping the N-type diffusion regions 123 and 125. The N+ region 125 forms the drain terminal D, the N+ region 123 forms the source terminal S, and the gate insulator 129 forms the gate terminal G. The gate and drain terminals of the N-channel device 113 are coupled to corresponding signals (not shown) on the IC 100 depending upon the particular function of the device. The source terminal of the N-channel device 113 is shown coupled to a core reference voltage VSS, which is a signal ground in the illustrated embodiment. The P+ region 127 forms a well or bulk connection B which is shown coupled to a substrate bias rail 106 providing a substrate bias voltage VBPA for N-channel devices.

It is understood that the core voltages VSS and VDD are provided throughout an IC or chip using conductors or conductive traces or the like, such as conductive vias, conductive nodes, conductive rails, conductive buses or bus signals and the like as known to those skilled in the art. The substrate bias voltage rails 104 and 106 are also implemented as conductors or conductive traces or the like.

The substrate bias circuit 102 includes a bias generator 112 having outputs developing the substrate bias voltages VBNA and VBPA on the substrate bias rails 104 and 106, respectively. In the illustrated embodiment, the bias generator 112 is implemented as a charge pump integrated on the IC 100 although other types of voltage generators are contemplated. The bias generator 112 is controlled via bias control signals BCTL provided by a control circuit 114. The control circuit 114 has an output providing a voltage clamp enable signal ENP to the input of a P-type level shifter (LSP) circuit 116, which has an output providing a corresponding clamp enable signal PEN to the gate of a P-channel clamp device PC1. PC1 has its source coupled to VDD and its drain and bulk coupled to the substrate bias rail 104. The control circuit 114 has another output providing another voltage clamp enable signal ENN to the input of an N-type level shifter (LSN) circuit 118, which has an output providing a corresponding clamp enable signal NEN to the gate of an N-channel clamp device NC1. NC1 has its source coupled to VSS and its drain and bulk coupled to the substrate bias rail 106. The control circuit 114 switches the ENP and ENN control signals between a normal voltage range of VSS and VDD for the IC 100. The LSP circuit 116 shifts the voltage range of the PEN signal to operate between VSS and VBNA and the LSN circuit 118 shifts the voltage range of the NEN signal to operate between VBPA and VDD as further described below. In general, when the control circuit 114 asserts the ENP signal low, the PEN signal is asserted low to turn PC1 on to clamp the substrate bias rail 104 to VDD. When the control circuit 114 asserts the ENP signal high, PC1 is turned off. Likewise, when the control circuit 114 asserts the ENN signal high, the NEN signal is asserted high to turn NC1 on to clamp the substrate bias rail 106 to VSS. When the control circuit 114 asserts the ENN signal low, NC1 is turned off.

When it is desired to operate the IC 100 in the low power mode, the control circuit 114 asserts ENP high and ENN low to turn off the clamp devices PC1 and NC1. It is noted that the IC 100 may have multiple operating states or modes, including one or more low power modes or states in which at least a portion of the area of the IC 100 is placed in a low power condition or otherwise turned off. In the low power mode, the control circuit 114 also controls the bias generator 112 to drive the voltage of VBNA above VDD by a first substrate bias offset voltage and to drive the voltage of VBPA below VSS by a second substrate bias offset voltage. The first and second substrate bias offset voltages may be equivalent or they may be different voltages depending upon the particular configuration. In the low power mode, therefore, the bulk of the P-channel device 111 is pulled above VDD and the bulk connection of the N-channel device 113 is pulled below VSS to minimize sub-threshold leakage current in both devices. When it is desired to switch the IC 100 to the dynamic mode for normal operation, the control circuit 114 controls the bias generator 112 to drive the voltage of VBNA to the same voltage level of VDD and to drive the voltage of VBPA to the same voltage level of VSS. Thus, during normal dynamic mode operation, the bulk of the P-channel device 111 is driven to VDD and the bulk of the N-channel device 113 is driven to VSS.

The substrate bias rails 104 and 106 are routed to each device integrated on the P substrate 101 including the devices 111 and 113. It is desired that the VBNA and VBPA voltages be as consistent as possible along the substrate bias rails 104 and 106. In general, the larger the size of the P substrate 101 and/or the greater the number of integrated devices, the longer the substrate bias rails 104 and 106. The substrate bias rails 104 and 106 are implemented with physical conductors having a corresponding impedance resulting in an increasing voltage drop along the length of each rail the further away from the bias generator 112. If either of the devices 111 and 113 is located relatively far from the bias generator 112, then the voltage levels of VBNA and VBPA may vary from the voltage levels of VDD and VSS, respectively, by a significant amount which may have a negative impact on operation and compromise performance. Furthermore, the substrate bias rails 104 and 106 tend to propagate noise caused by capacitive coupling and the like further impairing operation and degrading performance.

The IC 100 is switched to normal mode by controlling the bias generator 112 to drive the voltage levels of VBNA and VBPA to VDD and VSS, respectively, and by asserting the ENP signal low (so that PEN goes low) and the ENN signal high (so that NEN goes high). In this manner, the clamp devices PC1 and NC1 clamp the substrate bias rails 104 and 106 to VDD and VSS, respectively. Although only one P-channel clamp device PC1 is shown for the substrate bias rail 104 and one N-channel clamp device NC1 is shown for the substrate bias rail 106, any number of clamp devices may be distributed along the length of each of the substrate bias rails 104 and 106. In one embodiment, the number and locations of the clamp devices are selected to clamp each substrate bias rail within a predetermined minimum voltage level of a corresponding one of the core voltages VDD and VSS. In this manner, when the clamp devices are activated, the voltage of the substrate bias rail 104 is "clamped" to VDD within the predetermined minimum voltage level and the voltage of the substrate bias rail 106 is clamped to VSS within the predetermined minimum voltage level. Such clamping reduces noise caused by capacitive coupling and minimizes voltage variation along both of the substrate bias rails 104 and 106. In one embodiment, after the substrate bias rails 104 and 106 are clamped to the core voltages VDD and VSS, the bias generator 112 may be shut down or otherwise switched to low power mode if desired to further reduce noise and to conserve power.

Figure 2:
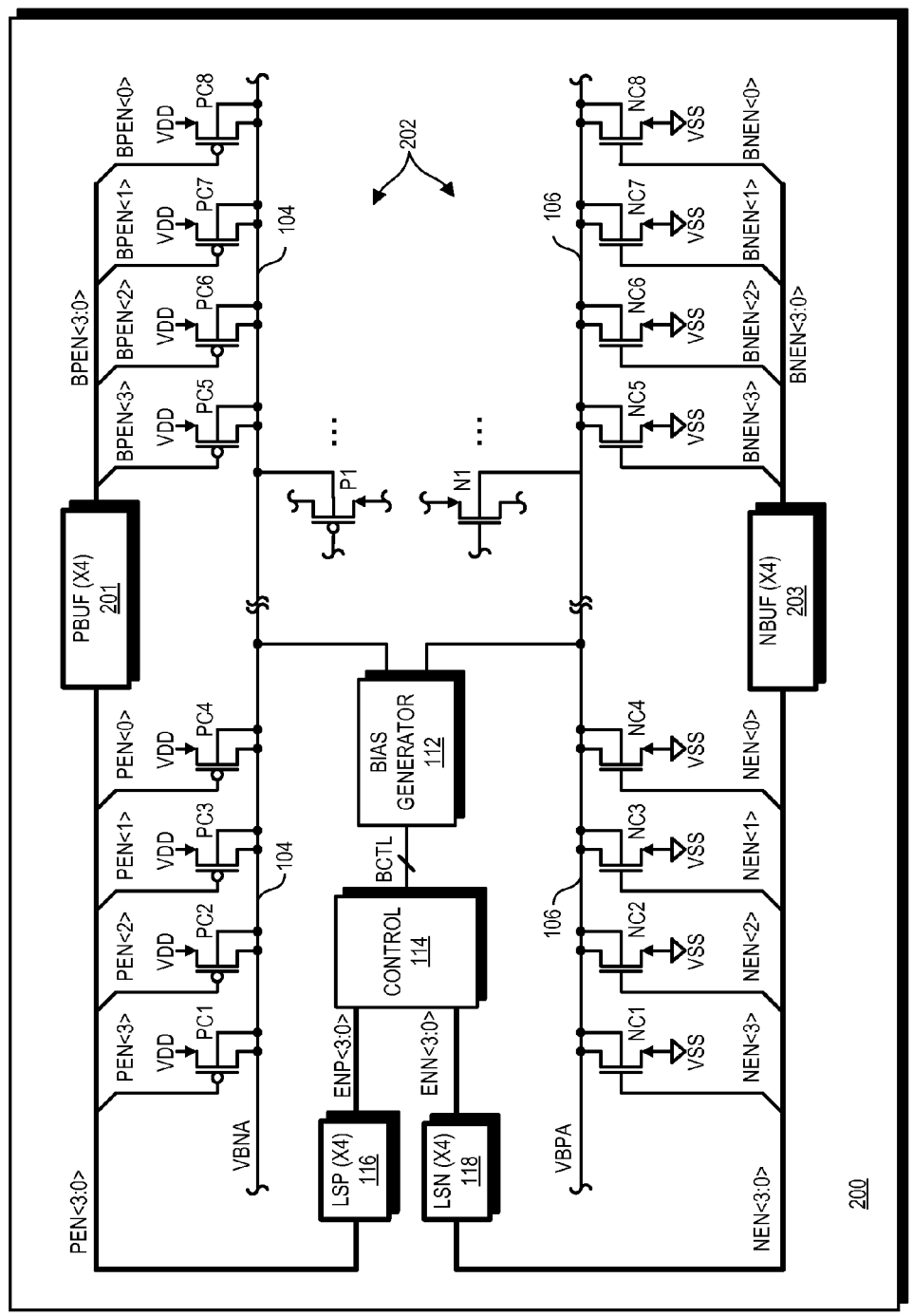
FIG. 2 is a schematic and block diagram of a substrate bias circuit integrated onto the die of a microprocessor including distributed clamp devices implemented according to an exemplary embodiment.

FIG. 2 is a schematic and block diagram of a substrate bias circuit 202 integrated onto the die of a microprocessor 200 including distributed clamp devices implemented according to an exemplary embodiment. The substrate bias circuit 202 is substantially similar to the substrate bias circuit 102 in which similar devices and components assume identical reference numbers. The bias generator 112 is shown with its outputs providing the substrate bias voltages VBNA and VBPA on the substrate bias rails 104 and 106, respectively. The substrate bias rails 104 and 106 are routed across the die of the microprocessor 200 to deliver the substrate bias voltages VBNA and VBPA to selected P-channel and N-channel devices integrated on the microprocessor 200. An exemplary P-channel device P1 is shown with a bulk connection to the substrate bias rail 104 in a similar manner as the P-channel device 111 and an exemplary N-channel device N1 is shown with a bulk connection to the substrate bias rail 106 in a similar manner as the N-channel device 113. Although only one P-channel device P1 and only one N-channel device N1 are shown, it is understood that many such devices may be provided on the microprocessor 200 with bulk connections to the applicable one of the substrate bias rails 104 and 106 in similar manner (as indicated by ellipses). P-channel clamp devices PC1, PC2, . . . , PC8 are shown coupled to and distributed along the substrate bias rail 104 and N-channel clamp devices NC1, NC2, . . . , NC8 are shown coupled to and distributed along the substrate bias rail 106. The drain and bulk of each of the P-channel clamp devices PC1-PC8 are coupled to the substrate bias rail 104 and their sources are coupled to VDD. The drain and bulk of each of the N-channel clamp devices NC1-NC8 are coupled to the substrate bias rail 106 and their sources are coupled to VSS. The control circuit 114 is shown providing the control signals BCTL to control the bias generator 112 in a similar manner as previously described for the IC 100. As shown, the control circuit 114 provides four P-type clamp enable signals ENP<3:0> to respective inputs of four P-type level shifter or LSP circuits 116, which output a corresponding four level-shifted clamp enable signals PEN<3:0>. Likewise, the control circuit 114 provides four N-type clamp enable signals ENN<3:0> to respective inputs of four N-type level shifter or LSN circuits 118, which output a corresponding four level-shifted clamp enable signals NEN<3:0>.

Each of the clamp enable signals PEN<3:0> is provided to the gate of a corresponding one of the P-channel clamp devices PC1-PC4. In particular, PEN<3> is provided to the gate of PC1, PEN<2> is provided to the gate of PC2, PEN<1> is provided to the gate of PC3, and PEN<0> is provided to the gate of PC4. Each of the clamp enable signals PEN<3:0> is provided to an input of a respective one of four P-type buffer circuits 201, which provide a corresponding four buffered clamp enable signals BPEN<3:0>. In particular, BPEN<3> is a buffered version of PEN<3>, BPEN<2> is a buffered version of PEN<2>, BPEN<1> is a buffered version of PEN<1>, and BPEN<0> is a buffered version of PEN<0>. BPEN<3> is provided to the gate of PC5, BPEN<2> is provided to the gate of PC6, BPEN<1> is provided to the gate of PC7, and BPEN<0> is provided to the gate of PC8. In this manner, whenever any one of the ENP<3:0> signals is asserted low, a corresponding one of the PEN<3:0> signals is asserted low turning on a corresponding one of the clamp devices PC1-PC4, and a corresponding one of the BPEN<3:0> signals is also asserted low turning on a corresponding one of the clamp devices PC5-PC8. As an example, when the control circuit asserts ENP<1> low, PEN<1> and BPEN<1> are also asserted low turning on clamp devices PC3 and PC7. In this manner, the control circuit 114 is able to selectively activate any one or more of the clamp devices PC1-PC8.

In a similar manner, each of the clamp enable signals NEN<3:0> is provided to the gate of a corresponding one of the N-channel clamp devices NC1-NC4. In particular, NEN<3> is provided to the gate of NC1, NEN<2> is provided to the gate of NC2, NEN<1> is provided to the gate of NC3, and NEN<0> is provided to the gate of NC4. Each of the clamp enable signals NEN<3:0> is provided to an input of a respective one of four N-type buffer circuits 203, which provide a corresponding four buffered clamp enable signals BNEN<3:0>. In particular, BNEN<3> is a buffered version of NEN<3>, BNEN<2> is a buffered version of NEN<2>, BNEN<1> is a buffered version of NEN<1>, and BNEN<0> is a buffered version of NEN<0>. BNEN<3> is provided to the gate of NC5, BNEN<2> is provided to the gate of NC6, BNEN<1> is provided to the gate of NC7, and BNEN<0> is provided to the gate of NC8. In this manner, whenever any one of the ENN<3:0> signals is asserted high, a corresponding one of the NEN<3:0> signals is asserted high turning on a corresponding one of the clamp devices NC1-NC4, and a corresponding one of the BNEN<3:0> signals is also asserted high turning on a corresponding one of the clamp devices NC5-NC8. As an example, when the control circuit 114 asserts ENN<2> high, NEN<2> and BNEN<2> are also asserted high turning on clamp devices NC2 and NC6. In this manner, the control circuit 114 is able to selectively activate any pair of the clamp devices NC1-NC8.

Although eight P-channel clamp devices PC1-PC8 and eight N-channel clamp devices NC1-NC8 are shown in FIG. 2, it is understood that any number of clamp devices and corresponding clamp enable signals may be implemented depending upon the particular size and configuration of the IC 100. Also, the illustrated grouping of P-type signals and clamp devices and N-type signals and clamp devices is arbitrary and for illustration only in which it is understood that many variations are possible and contemplated. For example, a single clamp control signal provided from the control circuit 114, after being level shifted, may be buffered as many times as desired to control as many clamp devices as desired. Also, although the clamp devices PC1-PC4 appear to be grouped together in the schematic depiction, the individual devices may be physically located within any desired proximity relative to each other. For example, although the clamp devices PC1 and PC2 appear to be adjacent to each other, they may be physically separated whereas the clamp devices PC1 and PC5 may be physically close to each other on the die of the microprocessor 200. It is appreciated that the use of multiple clamp control signals enables selective activation of clamping at selected area portions of the microprocessor 200. In one embodiment, the number and particular locations of the clamp devices along the rails 104 and 106 are determined based on dynamic simulations or the like to maintain the noise level within a predetermined minimum level to obtain optimal performance of the microprocessor 200.

In a similar manner as described above for the IC 100, the microprocessor 200 has multiple operating states or modes, including one or more low power modes or states in which at least a portion of the microprocessor 200 is placed in a low power condition or otherwise turned off. Multiple clamp devices, including the clamp devices PC1-PC8 and NC1-NC8, are distributed along the substrate bias rails 104 and 106 and across the substrate of the microprocessor 200. During normal operating conditions of the microprocessor 200, the control circuit 114 turns on or otherwise activates all or selected ones of the clamp devices to clamp the substrate bias rails 104 and 106 to the core voltages VDD and VSS, respectively. The control circuit 114 turns off the bias generator 112 or places it in a low power state, or otherwise controls the bias generator 112 to drive the substrate bias voltages VBNA and VBPA to the same voltage levels as VDD and VSS, respectively, during the normal operating mode. The control circuit 114 places the microprocessor 200 in a low power state or condition by first turning off all or selected ones of the clamp devices. The control circuit 114 then activates or otherwise controls the bias generator 112 to drive the voltage of VBNA above the voltage of VDD by the first substrate bias offset voltage and to drive the voltage of VBPA below the voltage of VSS by a second substrate bias offset voltage. The first and second substrate bias offset voltages may be the same or different voltage levels. In order to bring the microprocessor 200 back to the normal operating mode from the low power mode, the control circuit 114 first controls the bias generator 112 to drive the VBNA and VBPA voltages on the substrate bias rails 104 and 106 back to VDD and VSS, respectively. Then the control circuit 114 turns on all or selected ones of the clamp devices. As previously described, the control circuit 114 asserts all or selected ones of the ENP<3:0> and ENN<3:0> signals to turn on and off selected ones of the clamp devices PC1-PC8 and NC1-NC8.

Figure 3:
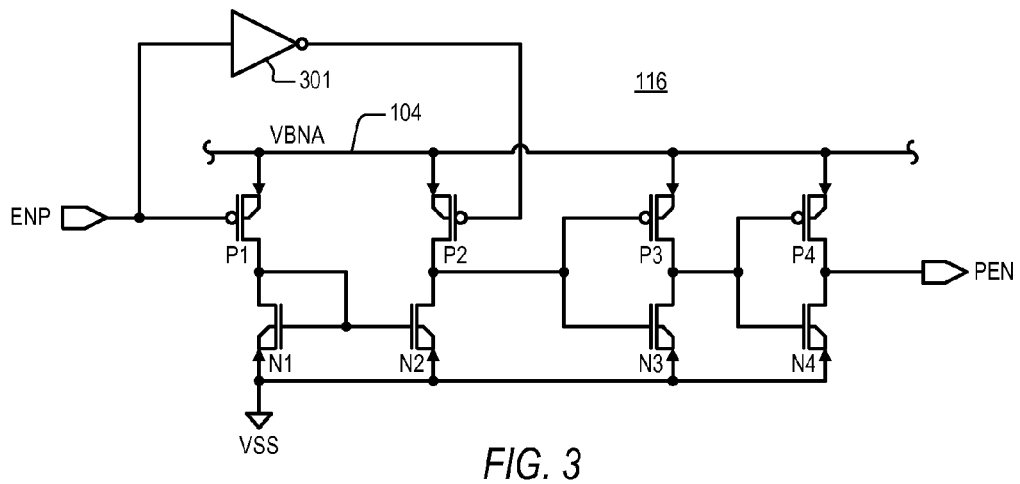
FIG. 3 is a schematic diagram of the LSP circuit of FIGS. 1 and 2 implemented according to an exemplary embodiment.

FIG. 3 is a schematic diagram of the LSP circuit 116 implemented according to an exemplary embodiment. The LSP circuit 116 includes an inverter 301, four P-channel devices P1, P2, P3 and P4 and four N-channel devices N1, N2, N3 and N4. Each of the P-channel devices P1-P4 has its source and substrate (internal) coupled to the rail 104 providing the VBNA voltage and each of the N-channel devices N1-N4 has its source and substrate (internal) coupled to VSS. The ENP signal is provided to the gate of P1 and to the input of the inverter 301. The drain of P1 is coupled to the drain and gate of N1 and to the gate of N2. The output of the inverter 301 is coupled to the gate of P2, which has its drain coupled to the drain of N2 and to the gates of P3 and N3. The drain of P3 is coupled to the drain of N3 and to the gates of P4 and N4. The drains of P4 and N4 are coupled together and develop the output PEN signal. In operation, the input ENP signal is asserted between the core voltages VSS and VDD whereas the output PEN signal is asserted between VSS and the substrate bias voltage VBNA. When ENP is asserted low to VSS, P1 is turned on and P2 is turned off (as output of the inverter 301 goes to VDD). P1 pulls the gate of N2 up towards VBNA so that N2 is turned on. N2 pulls the gates of P3 and N3 low to VSS turning P3 on and N3 off. P3 pulls the gates of P4 and N4 high towards VBNA turning N4 on and P4 off. Thus, when ENP is asserted low to VSS, PEN is pulled low to VSS via N4. When ENP is asserted high towards VDD, P1 is turned off and P2 is turned on. Since P1 is off, N1 pulls the gate of N2 low so that N2 is turned off. P2 pulls the gates of P3 and N3 high towards VBNA turning P3 off and N3 on. N3 pulls the gates of P4 and N4 low towards VSS turning P4 on and N4 off.

Thus, when ENP is asserted high towards VDD, P4 pulls the PEN signal high towards VBNA. In this manner, ENP switches between VSS and VDD whereas PEN switches between VSS and VBNA.

Figure 4:
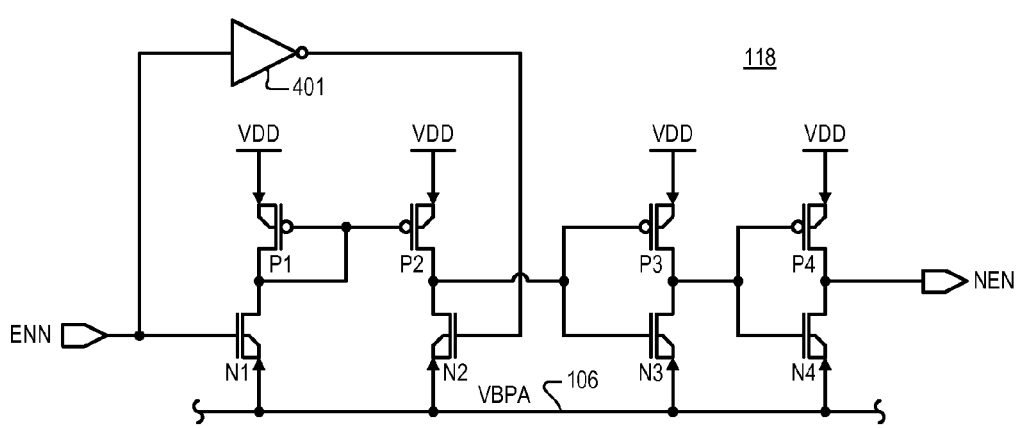
FIG. 4 is a schematic diagram of the LSN circuit of FIGS. 1 and 2 implemented according to an exemplary embodiment.

FIG. 4 is a schematic diagram of the LSN circuit 118 implemented according to an exemplary embodiment. The LSN circuit 118 includes an inverter 401, four P-channel devices P1, P2, P3 and P4 and four N-channel devices N1, N2, N3 and N4. Each of the P-channel devices P1-P4 has its source and substrate (internal) coupled to VDD and each of the N-channel devices N1-N4 has its source and substrate (internal) coupled to the rail 106 providing the VBPA voltage. The ENN signal is provided to the gate of N1 and to the input of the inverter 401. The drain and gate of P1 is coupled to the drain of N1 and to the gate of P2. The output of inverter 401 is coupled to the gate of N2 which has its drain coupled to the drain of P2 and to the gates of P3 and N3. The drain of P3 is coupled to the drain of N3 and to the gates of P4 and N4. The drains of P4 and N4 are coupled together and develop the output NEN signal. In operation, the input ENN signal is asserted between the core voltages VSS and VDD whereas the output NEN signal is asserted between the substrate bias voltage VBPA and VDD. When ENN is asserted high towards VDD, N1 is turned on and N2 is turned off (as output of inverter 401 goes towards VSS). N1 pulls the gate of P2 low towards VBPA so that P2 is turned on. P2 pulls the gates of P3 and N3 high towards VDD turning P3 off and N3 on. N3 pulls the gates of P4 and N4 low towards VBPA turning N4 off and P4 on. Thus, when ENN is asserted high towards VDD, NEN is pulled high towards VDD via P4. When ENN is asserted low towards VSS, N1 is turned off and N2 is turned on. Since N1 is off, P1 pulls the gate of P2 high so that P2 is off. N2 pulls the gates of P3 and N3 low towards VBPA turning P3 on and N3 off. P3 pulls the gates of P4 and N4 high towards VDD turning P4 off and N4 on. Thus, when ENN is asserted low towards VSS, N4 pulls the NEN signal low towards VBPA. In this manner, ENN switches between VSS and VDD whereas NEN switches between VBPA and VDD.

Referring back to FIG. 1, the LSP circuit 116 ensures that the clamp device PC1 turns fully off in low power mode when VBNA is driven above the voltage of VDD by the bias generator 112. In particular, the control circuit 114 asserts ENP high to VDD to turn off PC1 while the bias generator 112 drives VBNA above VDD. If the ENP signal was provided directly to the gate of PC1, then the gate of P1 would only be at VDD whereas its drain is above VDD potentially turning PC1 at least partially on. Instead, the LSP circuit 116 drives PEN to the voltage level of VBNA so that the gate and drain of PC1 are both at the voltage level of VBNA above VDD ensuring that PC1 is turned fully off. In a similar manner, the LSN circuit 118 ensures that the N-channel clamp device NC1 turns fully off in low power mode when VBPA is driven below the voltage of VSS by the bias generator 112. In particular, the control circuit 114 asserts ENN low to VSS to turn off NC1 while the bias generator 112 drives VBPA below VSS. If the ENN signal was provided directly to the gate of NC1, then the gate of NC1 would be at VSS whereas its drain is below VSS potentially turning NC1 at least partially on. Instead, the LSN circuit 118 drives NEN to the voltage level of VBPA so that the gate and drain of NC1 are both at the voltage level of VBPA below VSS ensuring that NC1 is turned fully off.

Referring back to FIG. 2, each of the LSP circuits 116 level shift a corresponding one of the PEN<3:0> signals to ensure that one or more of the P-channel clamp devices PC1-PC4 are turned fully off when the VBNA rail 104 is driven above the voltage level of VDD and the corresponding one or more of the PEN<3:0> signals are asserted high. As further described below, the PBUF circuits 201 drive the BPEN<3:0> signals to the same level-shifted voltage level between VSS and VBNA to ensure that the clamp devices PC5-PC8 are also turned fully off when the BPEN<3:0> signals are asserted high. In a similar manner, each of the LSN circuits 118 level shift a corresponding one of the NEN<3:0> signals to ensure that one or more of the N-channel clamp devices NC1-NC4 are turned fully off when the VBPA rail 106 is driven below the voltage level of VSS and the corresponding one or more of the ENN<3:0> signals are asserted low. As further described below, the NBUF circuits 203 drive the BNEN<3:0> signals to the same level-shifted voltage level between VDD and VBPA to ensure that the clamp devices NC5-NC8 are also turned fully off in low power mode when the BNEN<3:0> signals are asserted low.

Figure 5:
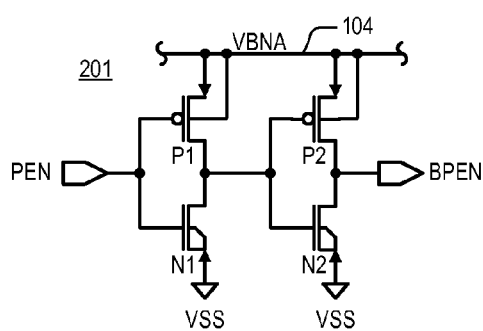
FIGS. 5 and 6 are schematic diagrams of P-type and N-type buffer circuits of FIG. 2 implemented.

FIG. 5 is a schematic diagram of a PBUF circuit 201 implemented according to an exemplary embodiment. The PEN signal is provided to the gates of a P-channel device P1 and an N channel device N1. The source and substrate of P1 are coupled to the VBNA rail 104 and the drain of P1 is coupled to the drain of N1. The drains of P1 and N1 are coupled to the gates of a P-channel device P2 and an N-channel device N2. The source and substrate of P2 are coupled to the VBNA rail 104 and the drain of P2 is coupled to the drain of N2. The sources of N1 and N2 are coupled to VSS and the drains of P2 and N2 develop the BPEN signal. In operation, when PEN is pulled low to VSS, P1 and N2 are both turned on while P2 and N1 are turned off so that BPEN is likewise driven to VSS. When PEN is pulled high to VBNA, P1 and N2 are both turned off while P2 and N1 are both turned on so that BPEN is pulled high to VBNA. In this manner, BPEN assumes the same logic state as PEN and switches between the level shifted voltage range of VSS and VBNA.

Figure 6:
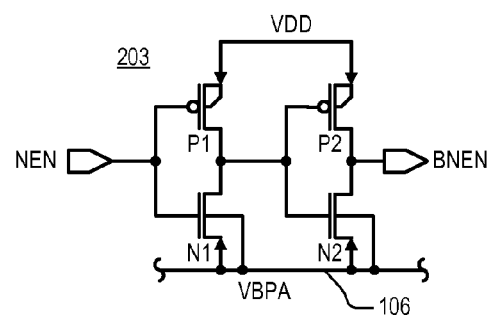

FIG. 6 is a schematic diagram of an NBUF circuit 203 implemented according to an exemplary embodiment. The NEN signal is provided to the gates of a P-channel device P1 and an N channel device N1. The source of P1 is coupled to VDD and the drain of P1 is coupled to the drain of N1. The source and substrate of N1 is coupled to the VBPA rail 106. The drains of P1 and N1 are coupled to the gates of a P-channel device P2 and an N-channel device N2. The source of P2 is coupled to VDD and the drain of P2 is coupled to the drain of N2. The source and substrate of N2 are coupled to the VBPA rail 106 and the drains of P2 and N2 develop the BNEN signal. In operation, when NEN is pulled low to VBPA, P1 and N2 are both turned on while P2 and N1 are turned off so that BNEN is likewise driven to VBPA. When NEN is pulled high to VDD, P1 and N2 are both turned off while P2 and N1 are both turned on so that BNEN is pulled high to VDD. In this manner, BNEN assumes the same logic state as NEN and switches between the level shifted voltage range of VDD and VBPA.

Figure 7:
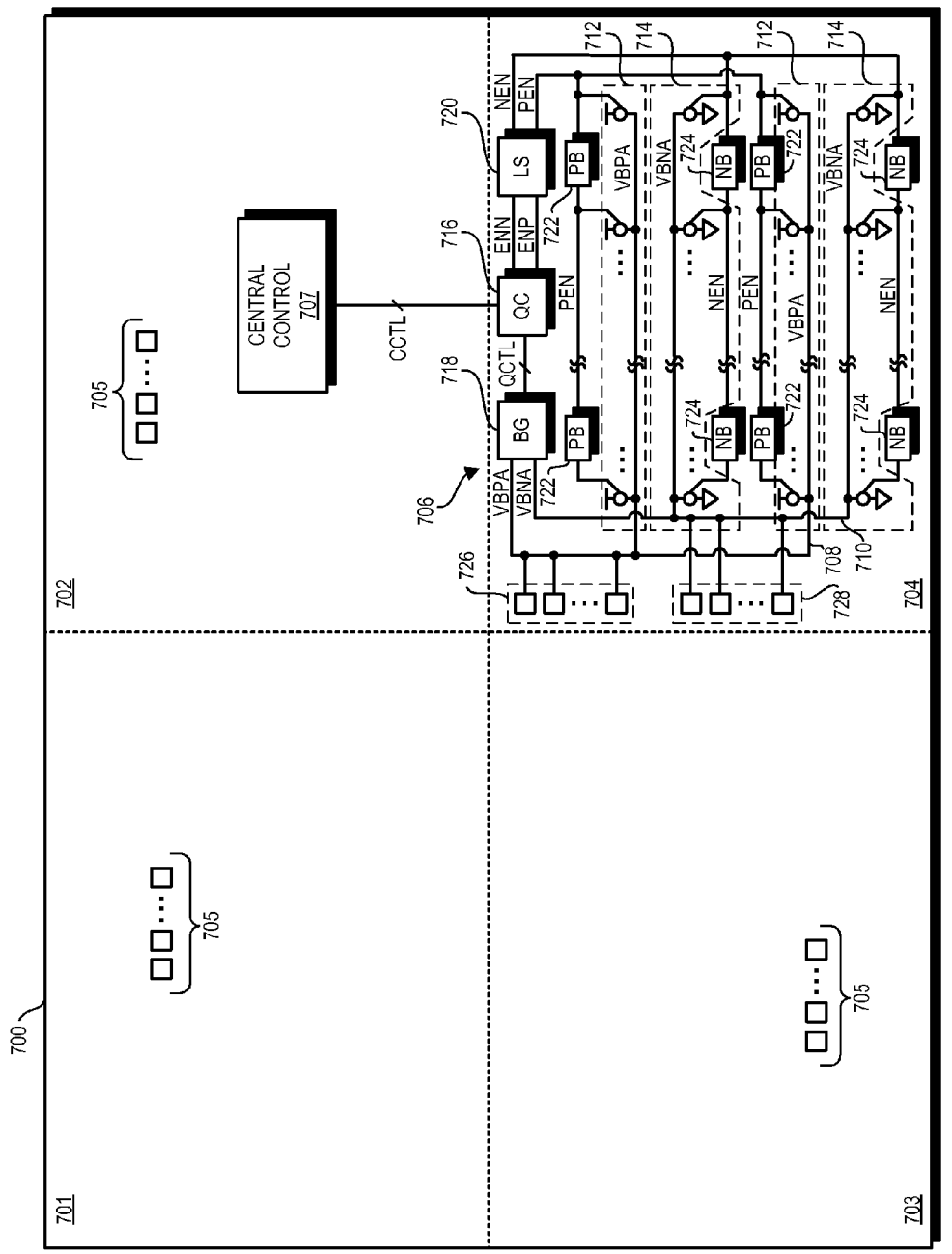
FIG. 7 is a schematic and block diagram of a substrate bias circuit integrated onto a selected area of the die of a microprocessor including distributed clamp devices implemented according to an exemplary embodiment.

FIG. 7 is a schematic and block diagram of a substrate bias circuit 706 integrated onto a selected area of the die of a microprocessor 700 including distributed clamp devices implemented according to an exemplary embodiment. In this case, the microprocessor 700 is generally divided into four areas or quadrants 701, 702, 703 and 704. In the illustrated embodiment, the substrate bias circuit 706 is provided for biasing devices located in quadrant 704 of the microprocessor 700 during a reduced power mode or state. The substrate bias circuit 706 is substantially similar to the substrate bias circuit 202 and is shown located completely or otherwise substantially within quadrant 704 of the microprocessor 700. The substrate bias circuit 706 includes a first substrate bias rail 708 for biasing P-channel devices 726 within the quadrant 704 and a second substrate bias rail 710 for biasing N-channel devices 728 within the quadrant 704. The devices 726 and 728 are configured in similar as the P-channel and N-channel devices 111 and 113 with bulk connections coupled to the substrate bias rails 708 and 710. The devices 726 and 728 are shown in simplified form as square symbols and bulk connections to the rails 708 or 710. The P-channel and N-channel devices 726 and 728 are shown aligned on one side of the quadrant 704 for ease of illustration although it is understood that these devices are actually distributed throughout the area of the quadrant 704.

In the illustrated embodiment, other devices 705 (P-channel and N-channel) are shown distributed within the quadrants 701-703 of the microprocessor 700. In at least one low power mode, the other devices 705 remain powered on and active while the devices 726 and 728 within the quadrant 704 are powered down. Any one or more of the other devices 705 outside the quadrant 704 may or may not have separate substrate biasing depending upon the particular configuration of the microprocessor 700. In one embodiment, a separate substrate bias circuit is provided for each of the other quadrants 701-703 for biasing the substrates in those quadrants if and when shut down. In another embodiment, certain of the other devices 705 may form or be part of a "critical path" for the microprocessor 700 in which substrate biasing is not provided or otherwise disabled for those devices.

Multiple P-channel clamp devices 712 are coupled between the substrate bias rail 708 and VDD and multiple N-channel clamp devices 714 are coupled between the substrate bias rail 710 and VSS. In one embodiment, the P-channel clamp devices 712 are each configured in substantially identical manner as the P-channel clamp devices PC1-PC8 and the N-channel clamp devices 714 are each configured in substantially identical manner as the N-channel clamp devices NC1-NC8 of the microprocessor 200, where the clamp devices 712 and 714 are shown in simplified form (circle symbols). The microprocessor 700 includes a central control circuit 707 which controls a quadrant control (QC) circuit 716 via corresponding control signals CCTL. Although the central control circuit 707 is shown located within quadrant 702, it is appreciated that the central control circuit 707 may be located anywhere on the microprocessor 700. The quadrant control circuit 716 provides control signals QCTL to control a bias generator (BG) 718, which operates substantially similar to the bias generator 112 having outputs developing the substrate bias voltages VBPA and VBNA on the substrate bias rails 708 and 710, respectively. The quadrant control circuit 716 provides clamp enable signals ENN and ENP to a level shift (LS) circuit 720. The LS circuit 720 includes a P-type level shifter (not shown) and an N-type level shifter circuit (not shown) which are similar to the level shifter circuits 116 and 118, respectively, for converting the ENN and ENP signals from the quadrant control circuit 716 to the level-shifted signals NEN and PEN, respectively. In the illustrated embodiment, the NEN signal ultimately controls all of the clamp devices 714 and the PEN signal ultimately controls all of the clamp devices 712. P-type buffer (PB) circuits 722 are distributed along the PEN signal line at as many locations as necessary or desired to buffer the PEN signal. Similarly, N-type buffer (NB) circuits 724 are distributed along the NEN signal line at as many locations as necessary or desired to buffer the NEN signal.

The substrate bias circuit 706 operates in substantially similar manner as the substrate bias circuit 202. During normal operation when the devices 726 and 728 within the quadrant 704 are powered up, the quadrant control circuit 716 instructs the bias generator 718 to drive the substrate bias rails 708 and 710 to the voltage levels of VDD and VSS, respectively. The quadrant control circuit 716 asserts the ENN and ENP signals to turn on the clamp devices 712 and 714 to clamp the substrate bias rails 708 and 710 to VDD and VSS, respectively. The level shift circuit 720 asserts the NEN and PEN signals to level-shifted levels accordingly as previously described. The bias generator 718 may be turned off or placed in low power mode if desired. During a low power state when the devices 726 and 728 within the quadrant 704 are powered down, the quadrant control circuit 716 asserts the ENN and ENP signals to turn off the clamp devices 712 and 714 and the level shift circuit 720 asserts the NEN and PEN signals to level-shifted levels accordingly. The quadrant control circuit 716 instructs the bias generator 718 to drive the substrate bias rail 708 to an offset voltage above VDD and to drive the substrate bias rail 710 to an offset voltage below VSS in a similar manner as previously described. Thus, during the low power mode, sub-threshold leakage is reduced and the clamp devices 722 and 724 are turned fully off. In this manner, the entire quadrant 704 of the microprocessor 700 is effectively shut down while many or all of the devices within the remaining quadrants 701-703 remain powered on and active.

It is appreciated by those of ordinary skill in the art that many variations are possible. The central control circuit 707 may be located anywhere on the microprocessor 700 and may control other substrate bias circuits (not shown) similar to the substrate bias circuit 706 and located on the microprocessor 700. For example, each of the other quadrants 701-703 may include a similar substrate bias circuit as controlled by the central control circuit 707 for biasing one or more of the other devices 705. Although the substrate bias circuit 706 is shown for biasing devices located within a particular quadrant 704 of the microprocessor 700, it may be adjusted to any relative size and/or location for biasing devices within any selected area or region of the microprocessor 700 (e.g., ⅛, ¼, ½, ¾, etc.). Also, any number of substrate bias circuits may be provided for biasing devices located within selected areas of the microprocessor 700. Furthermore, a bias generator may be shared by multiple substrate bias circuits.

Figure 8:
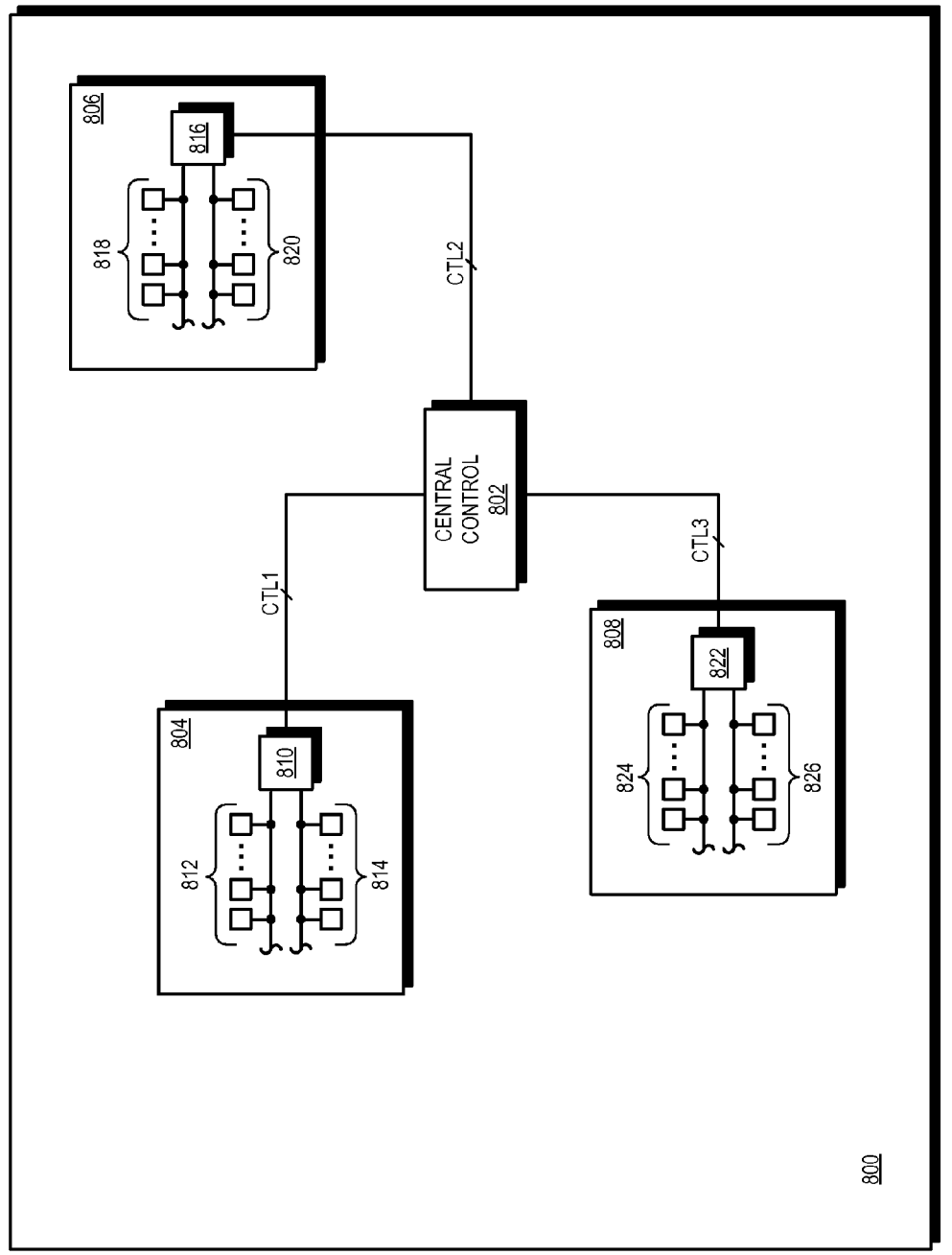
FIG. 8 is a simplified block diagram of a microprocessor divided into multiple areas in which each area includes a substrate bias circuit with distributed clamp devices implemented according to an exemplary embodiment.

FIG. 8 is a simplified block diagram of a microprocessor 800 divided into multiple areas in which each area includes a substrate bias circuit with distributed clamp devices implemented according to an exemplary embodiment. A central control circuit 802 provides control signals CTL1, CTL2 and CTL3 to control substrate biasing for devices within areas 804, 806 and 808, respectively. The control signals CTL1 control a substrate bias circuit 810 of the area 804, the control signals CTL2 control a substrate bias circuit 816 of the area 806, and the control signals CTL3 control a substrate bias circuit 822 of the area 808. Each of the substrate bias circuits 810, 816 and 822 are configured in substantially similar manner as the substrate bias circuit 706 for providing substrate bias voltages on a corresponding pair of substrate bias rails within each area. In this manner, the substrate bias circuit 810 provides substrate biasing for P-channel devices 812 and N-channel devices 814 within the area 804, the substrate bias circuit 816 provides substrate biasing for P-channel devices 818 and N-channel devices 820 within the area 806, and the substrate bias circuit 822 provides substrate biasing for P-channel devices 824 and N-channel devices 826 within the area 808. Although not explicitly shown in FIG. 8, it is understood that P-channel and N-channel clamp devices are provided for and coupled to each of the substrate bias rails within each of the areas 804, 806 and 808 and controlled by the respective substrate bias circuits in a similar manner as described for the substrate bias circuit 706. In this manner, the central control circuit 802 can selectively shut down the devices in any one or more of the areas 804, 806 and 808, where the corresponding substrate bias circuits provide substrate biasing for corresponding devices within the areas that are shut down to minimize sub-threshold leakage current. Also, when any given one of the areas 804, 806 and 808 is shut down, the substrate bias circuits include level shift circuits to turn the clamp devices fully off. Furthermore, when any given one of the areas 804, 806 and 808 is activated, the corresponding clamp devices are turned on to clamp the substrate bias rails to the power voltages VDD and VSS to minimize noise.

In a more specific embodiment that may apply to any of the embodiments previously described, the core voltages are such that VSS is approximately 0 Volts (V) and VDD is approximately 1V. The bias generator drives an offset voltage up to 800 millivolts (mV) relative to the corresponding core voltage levels. In one embodiment, VBNA is charged up to approximately 1.8V when VDD is 1V and VBPA is pulled down to approximately −800 mV when VSS is 0V during the low power mode. It is understood that the actual core voltages may vary depending upon the operating mode of the device. For example, VDD may range between approximately 500 mV to 1.4V in certain configurations or under certain conditions. And further, the bias voltage offset for VBNA may be different from the bias voltage offset for VBPA. For example, alternative bias offset voltages are contemplated, such as 300 mV or 500 mV or the like. In any event, the VBNA and VBPA rails 104 and 106 are driven by the bias generator 112 to respective voltage offsets relative to the normal core voltages.

In one embodiment, the substrate bias clamp devices are positioned along the substrate bias rails to ensure that the voltage of each rail does not vary from the nominal levels of the core voltages by a predetermined minimum voltage level when the clamp devices are activated. In a more particular embodiment, the predetermined minimum voltage level is approximately 10 mV. The predetermined minimum voltage level is determined according to the particular specifications or parameters of the applicable device, such as the IC 100 or the microprocessors 200, 700 or 800. The placement of the clamp devices may be determined using any of a variety of methods, such as mathematical modeling analysis or dynamic simulations and the like to ensure that the voltages of the substrate bias rails are maintained within the predetermined minimum voltage level relative to the core voltages of VDD and VSS, respectively.

In alternative embodiments the substrate bias voltages may be provided off-chip so that the IC or chip substrate may or may not include a bias generator. For example, the IC 100 or the microprocessor 200 may not include the bias generator 112 so that the substrate bias voltages VBNA and VBPA are externally provided. The same is true for the microprocessor 700 (which may not include the bias generator 718) and any one or more of the substrate bias circuits 810, 816 and 822 of the microprocessor 800. Operation is substantially the same when the bias generator is not included since the control circuit still controls the clamping devices and corresponding circuitry.

Although the present invention has been described in considerable detail with reference to certain preferred versions thereof, other versions and variations are possible and contemplated. For example, the circuits described herein may be implemented in any suitable manner including logic devices or circuitry or the like. Any number of the functions described for the logic circuits may be implemented in software or firmware within an integrated device. Those skilled in the art should appreciate that they can readily use the disclosed conception and specific embodiments as a basis for designing or modifying other structures for carrying out the same pur-

What is claimed is:

1. A microprocessor, comprising:
a first substrate bias rail which provides a first bias voltage during a first operating mode and a second substrate bias rail providing a second bias voltage during said first operating mode;
a first supply node providing a core voltage and a second supply node providing reference voltage;
wherein said first bias voltage is provided at a positive voltage offset relative to said core voltage and wherein said second bias voltage is provided at a negative voltage offset relative to said reference voltage during said first operating mode;
a plurality of clamp devices comprising a plurality of P-channel devices coupled between said first substrate bias rail and said first supply node and a plurality of N-channel devices coupled between said second substrate bias rail and said second supply node;
a P-type level shift circuit having an input coupled to a first output of a control logic and an output coupled to a gate of at least one of said plurality of P-channel devices;
an N-type level shift circuit having an input coupled to a second output of said control logic and an output coupled to a gate of at least one of said plurality of N-channel devices;
a P-type buffer having an input coupled to said output of said P-type level shift circuit and an output coupled to at least one of said plurality of P-channel devices, wherein said P-type buffer switches its output between said reference voltage and said first bias voltage;
an N-type buffer having an input coupled to said output of said N-type level shift circuit and an output coupled to at least one of said plurality of N-channel devices, wherein said N-type buffer switches its output between said core voltage and said second bias voltage;
said control logic comprising said first output providing a first control signal for controlling said plurality of P-channel devices and said second output for providing a second control signal for controlling said plurality of N-channel devices, wherein said control logic turns on said plurality of clamp devices to clamp said first substrate bias rail to said first supply node and to clamp said second substrate bias rail to said second supply node during a second operating mode and which turns off said plurality of clamp devices during said first operating mode; and
wherein said control logic switches said first control signal and said second control signal between said reference voltage and said core voltage, wherein said P-type level shift circuit switches its output between said reference voltage and said first bias voltage in response to said first control signal, and wherein said N-type level shift circuit switches its output between said core voltage and said second bias voltage in response to said second control signal.

2. The microprocessor of claim 1, further comprising:
a substrate having a first area and a separate second area;
a plurality of first semiconductor devices located within said first area and a plurality of second semiconductor devices located within said second area; and
wherein said first substrate bias rail is routed to said plurality of first semiconductor devices located within said first area of said substrate for biasing said plurality of first semiconductor devices during said first operating mode while said plurality of second semiconductor devices remain powered on.

3. The microprocessor of claim 2, wherein said plurality of P-channel devices are distributed along said first substrate bias rail within said first area of said substrate.

4. A microprocessor, comprising:
a first substrate bias rail which provides a first bias voltage during a first operating mode;
a first supply node providing a core voltage;
at least one clamp device coupled between said first substrate bias rail and said first supply node;
control logic, coupled to said at least one clamp device, which turns on said at least one clamp device to clamp said first substrate bias rail to said first supply node during a second operating mode and which turns off said at least one clamp device during said first operating mode;
a substrate having a first area and a separate second area;
wherein said first substrate bias rail is located within said first area;
a second substrate bias rail located within said second area and providing a second bias voltage during a third operating mode;
said at least one clamp device comprising a first plurality of clamp devices located within said first area and coupled between said first substrate bias rail and said first supply node and a second plurality of clamp devices located in said second area and coupled between said second substrate bias rail and said first supply node; and
wherein said control logic turns on said first and second plurality of clamp devices to clamp said first substrate bias rail to said first supply node and to clamp said second substrate bias rail to said first supply node during said second operating mode, turns off said first plurality of clamp devices and turns on said second plurality of clamp devices during said first operating mode, and turns off said second plurality of clamp devices during said third operating mode.

5. A microprocessor, comprising:
a first substrate bias rail which provides a first bias voltage during a first operating mode;
a first supply node providing a core voltage;
at least one clamp device coupled between said first substrate bias rail and said first supply node;
control logic, coupled to said at least one clamp device, which turns on said at least one clamp device to clamp said first substrate bias rail to said first supply node during a second operating mode and which turns off said at least one clamp device during said first operating mode;
a substrate having a first area and a separate second area;
wherein said first substrate bias rail is located within said first area;
a second substrate bias rail located within said second area and providing a second bias voltage during said first operating mode;
said at least one clamp device comprising a first plurality of clamp devices located within said first area and coupled between said first substrate bias rail and said first supply node and a second plurality of clamp devices located in said second area and coupled between said second substrate bias rail and said first supply node; and
wherein said control logic turns off said second plurality of clamp devices and turns on said first plurality of clamp devices to clamp said first substrate bias rail to said first supply node during said second operating mode, and turns off said first plurality of clamp devices and turns on said second plurality of clamp devices to clamp said second substrate bias rail to said first supply node during said first operating mode.

6. An integrated circuit, comprising:
a substrate divided into first and second areas each having a plurality of semiconductor devices;
first and second bias rails provided on said substrate located exclusively within said first area of said substrate;
a first supply conductor provided on said substrate and providing a positive core voltage relative to a reference voltage provided by a second supply conductor provided on said substrate;
wherein a first bias voltage is provided on said first bias rail and a second bias voltage is provided on said second bias rail during a first state of the integrated circuit, wherein said first bias voltage is above said positive core voltage and wherein said second bias voltage is below said reference voltage;
at least one first clamp device located exclusively within said first area of said substrate, each said at least one first clamp device coupled between said first supply conductor and said first bias rail;
at least one second clamp device provided on said substrate, each said at least one second clamp device coupled between said second supply conductor and said second bias rail; and
a control circuit having a first output for controlling said at least one first clamp device and a second output for controlling said at least one second clamp device;
wherein said control circuit turns off said at least one first clamp device and said at least one second clamp device during said first state, and wherein said control circuit turns on said at least one first clamp device and said at least one second clamp device during a second state of the integrated circuit to clamp said first bias rail to said first supply conductor and to clamp said second bias rail to said second supply conductor.

7. The integrated circuit of claim 6, wherein said at least one first clamp device comprises a first P-channel device having a source coupled to said first supply conductor, a drain coupled to said first bias rail, and a gate controlled by said first output of said control circuit, and wherein said at least one second clamp device comprises a first N-channel device having a source coupled to said second supply conductor, a drain coupled to said second bias rail, and a gate controlled by said second output of said control circuit.

8. The integrated circuit of claim 7, wherein said first P-channel device includes a bulk connection coupled to said first bias rail and wherein said first N-channel device includes a bulk connection coupled to said second bias rail.

9. The integrated circuit of claim 7, further comprising:
a first level shift circuit having an input coupled to said first output of said control circuit and an output coupled to said gate of said first P-channel device, wherein said control circuit switches said first output of said control circuit to said reference voltage to turn on said first P-channel device and to said positive core voltage to turn off said first P-channel device, and wherein said first level shift circuit switches said gate of said first P-channel device to said reference voltage to turn on said first P-channel device and to said first bias voltage to turn off said first P-channel device; and
a second level shift circuit having an input coupled to said second output of said control circuit and an output coupled to said gate of said first N-channel device, wherein said control circuit switches said second output of said control circuit to said positive core voltage to turn on said first N-channel device and to said reference voltage to turn off said first N-channel device, and wherein said second level shift circuit switches said gate of said first N-channel device to said positive core voltage to turn on said first N-channel device and to said second bias voltage to turn off said first N-channel device.

10. The integrated circuit of claim 6, wherein said at least one first clamp device comprises a plurality of first clamp devices are distributed at locations along said first bias rail to maintain voltage of said first bias rail within a predetermined first voltage offset relative to said positive core voltage while said plurality of first clamp devices are turned on during said second state, and wherein said at least one second clamp device comprises a plurality of second clamp devices distributed at locations along said second bias rail to maintain voltage of said second bias rail within a predetermined second voltage offset relative to said reference voltage while said plurality of second clamp devices are turned on during said second state.

11. An integrated circuit, comprising:
a substrate;
first and second bias rails provided on said substrate;
a first supply conductor provided on said substrate and providing a positive core voltage relative to a reference voltage provided by a second supply conductor provided on said substrate;
wherein a first bias voltage is provided on said first bias rail and a second bias voltage is provided on said second bias rail during a first state of the integrated circuit, wherein said first bias voltage is above said positive core voltage and wherein said second bias voltage is below said reference voltage;
at least one first clamp device provided on said substrate, each said at least one first clamp device coupled between said first supply conductor and said first bias rail;
at least one second clamp device provided on said substrate, each said at least one second clamp device coupled between said second supply conductor and said second bias rail;
a control circuit having a first output for controlling said at least one first clamp device and a second output for controlling said at least one second clamp device, wherein said control circuit turns off said at least one first clamp device and said at least one second clamp device during said first state, and wherein said control circuit turns on said at least one first clamp device and said at least one second clamp device during a second state of the integrated circuit to clamp said first bias rail to said first supply conductor and to clamp said second bias rail to said second supply conductor;
wherein said at least one first clamp device comprises a first P-channel device having a source coupled to said first supply conductor, a drain coupled to said first bias rail, and a gate controlled by said first output of said control circuit, and wherein said at least one second clamp device comprises a first N-channel device having a source coupled to said second supply conductor, a drain coupled to said second bias rail, and a gate controlled by said second output of said control circuit;
a first level shift circuit having an input coupled to said first output of said control circuit and an output coupled to said gate of said first P-channel device, wherein said control circuit switches said first output of said control circuit to said reference voltage to turn on said first P-channel device and to said positive core voltage to turn off said first P-channel device, and wherein said first level shift circuit switches said gate of said first P-channel device to said reference voltage to turn on said first P-channel device and to said first bias voltage to turn off said first P-channel device;

a second level shift circuit having an input coupled to said second output of said control circuit and an output coupled to said gate of said first N-channel device, wherein said control circuit switches said second output of said control circuit to said positive core voltage to turn on said first N-channel device and to said reference voltage to turn off said first N-channel device, and wherein said second level shift circuit switches said gate of said first N-channel device to said positive core voltage to turn on said first N-channel device and to said second bias voltage to turn off said first N-channel device;

said at least one first clamp device further comprising a second P-channel device having a source coupled to said first supply conductor, a drain coupled to said first bias rail, and a gate;

a first buffer circuit having an input coupled to said output of said first level shift circuit and an output coupled to said gate of said second P-channel device, wherein said first buffer circuit switches its output to follow said output of said first level shift circuit between said reference voltage and said first bias voltage;

said at least one second clamp device further comprising a second N-channel device having a source coupled to said second supply conductor, a drain coupled to said second bias rail, and a gate; and a second buffer circuit having an input coupled to said output of said second level shift circuit and an output coupled to said gate of said second N-channel device, wherein said second buffer circuit switches its output to follow said output of said second level shift circuit between said positive core voltage and said second bias voltage.

12. A method of reducing noise of a microprocessor chip which includes a first substrate bias rail used to reduce sub-threshold leakage and which develops a core voltage, said method comprising:

clamping the first substrate bias rail to the core voltage when the microprocessor chip is in a first power state;

unclamping the first substrate bias rail and receiving a first substrate bias voltage on the first substrate bias rail when the microprocessor chip is in a second power state;

connecting a drain and a source of a first semiconductor device between the first substrate bias rail and the core voltage, turning on the first semiconductor device when the microprocessor is in the first power state, and turning off the first semiconductor device when the microprocessor is in the second power state;

wherein said receiving the first substrate bias voltage comprises charging the first substrate bias rail to an offset voltage relative to the core voltage;

wherein said turning off the first semiconductor device comprises providing a first clamp enable signal which asserts a gate of the first semiconductor device to the offset voltage relative to the core voltage;

connecting a drain and a source of a second semiconductor device between the first substrate bias rail and the core voltage; and providing a buffer on the microprocessor chip which receives the first clamp enable signal and which provides a second clamp enable signal to a gate of the second semiconductor device, wherein the second clamp enable signal follows the voltage level of the first clamp enable signal.

13. The method of claim 12, wherein said clamping the first substrate bias rail to the core voltage comprises turning on a first plurality of clamp devices distributed along the first substrate bias rail at locations selected to maintain voltage of said first substrate bias rail within a predetermined voltage offset relative to the core voltage.

14. A method of reducing noise of a microprocessor chip which includes a first substrate bias rail used to reduce sub-threshold leakage and which develops a core voltage, wherein the microprocessor chip is divided into first and second areas and includes a second substrate bias rail in which the first substrate bias rail is located within the first area and the second substrate bias rail is located in the second area, said method further comprising:

clamping the first substrate bias rail to the core voltage when the microprocessor chip is in a first power state;

unclamping the first substrate bias rail and receiving a first substrate bias voltage on the first substrate bias rail when the microprocessor chip is in a second power state;

clamping the second substrate bias rail to the core voltage when the microprocessor chip is in the first and second power states; and unclamping the second substrate bias rail and receiving a second substrate bias voltage on the second substrate bias rail when the microprocessor chip is in a third power state.

15. A method of reducing noise of a microprocessor chip which includes a first substrate bias rail used to reduce sub-threshold leakage and which develops a core voltage, wherein the microprocessor chip is divided into first and second areas and includes a second substrate bias rail, and wherein the first substrate bias rail is located within the first area and the second substrate bias rail is located in the second area, said method further comprising:

clamping the first substrate bias rail to the core voltage when the microprocessor chip is in a first power state;

unclamping the first substrate bias rail and receiving a first substrate bias voltage on the first substrate bias rail when the microprocessor chip is in a second power state;

clamping the second substrate bias rail to the core voltage when the microprocessor chip is in the second power state; and unclamping the second substrate bias rail and receiving a second substrate bias voltage on the second substrate bias rail when the microprocessor chip is in the first power state.

* * * * *